(12) United States Patent
Zhu et al.

(10) Patent No.: US 11,114,638 B2
(45) Date of Patent: Sep. 7, 2021

(54) LIGHT-EMITTING DIODE, ARRAY SUBSTRATE, AND METHOD OF MAKING THE SAME

(71) Applicants: Hefei Xinsheng Optoelectronics Technology Co., Ltd., Anhui (CN); BOE Technology Group Co., Ltd., Beijing (CN)

(72) Inventors: Ruhui Zhu, Beijing (CN); Yu Wang, Beijing (CN); Qinghua Zou, Beijing (CN); Gu Yao, Beijing (CN); Suwei Zeng, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 215 days.

(21) Appl. No.: 16/473,844

(22) PCT Filed: Dec. 13, 2017

(86) PCT No.: PCT/CN2017/115916
§ 371 (c)(1),
(2) Date: Jun. 26, 2019

(87) PCT Pub. No.: WO2018/223647
PCT Pub. Date: Dec. 13, 2018

(65) Prior Publication Data
US 2020/0127226 A1 Apr. 23, 2020

(30) Foreign Application Priority Data
Jun. 5, 2017 (CN) .......................... 201710413528.5

(51) Int. Cl.
*H01L 27/32* (2006.01)
*H01L 51/56* (2006.01)
(Continued)

(52) U.S. Cl.
CPC ...... *H01L 51/5228* (2013.01); *H01L 27/3244* (2013.01); *H01L 51/0021* (2013.01);
(Continued)

(58) Field of Classification Search
CPC ............. H01L 51/5228; H01L 27/3244; H01L 51/5225; H01L 51/0021; H01L 51/56;
(Continued)

(56) References Cited

U.S. PATENT DOCUMENTS 6,433,358 B1    8/2002  Beierlein
10,510,979 B2 * 12/2019  You ..................... H01L 51/5215
(Continued)

FOREIGN PATENT DOCUMENTS

CN        1945847 A      4/2007
CN      101055921 A     10/2007
(Continued)

OTHER PUBLICATIONS

Extended European Search Report in the European Patent Application No. 17912830.1, dated Dec. 7, 2020.
(Continued)

*Primary Examiner* — Savitri Mulpuri
(74) *Attorney, Agent, or Firm* — Intellectual Valley Law, P.C.

(57) ABSTRACT

The present application discloses an organic light-emitting diode (OLED). The OLED includes a first electrode and an organic light-emitting layer on the first electrode. Additionally, the OLED includes a second electrode on a side of the organic light-emitting layer distal to the first electrode. Furthermore, the OLED includes a substantially transparent protective layer on a side of the second electrode layer distal to the organic light emitting layer. Moreover, the OLED includes a substantially transparent conductive layer on a side of the substantially transparent protective layer distal to
(Continued)

the second electrode, the substantially transparent conductive layer electrically connected to the second electrode.

6 Claims, 3 Drawing Sheets

(51) Int. Cl.
  *H01L 51/52* (2006.01)
  *H01L 51/00* (2006.01)
(52) U.S. Cl.
  CPC ...... *H01L 51/5225* (2013.01); *H01L 51/5234* (2013.01); *H01L 51/56* (2013.01); *H01L 2251/5315* (2013.01); *H01L 2251/558* (2013.01)
(58) Field of Classification Search
  CPC ........... H01L 51/5234; H01L 2251/558; H01L 2251/5315
  See application file for complete search history.

(56) References Cited

U.S. PATENT DOCUMENTS

| | | | |
|---|---|---|---|
| 10,581,029 B2 * | 3/2020 | Wang | H01L 51/5225 |
| 2001/0043046 A1 | 11/2001 | Fukunaga | |
| 2006/0220534 A1 | 10/2006 | Shibanuma et al. | |
| 2007/0080377 A1 | 4/2007 | Sung et al. | |
| 2007/0228942 A1 | 10/2007 | Akai et al. | |
| 2007/0241663 A1 | 10/2007 | Huang et al. | |
| 2012/0056208 A1 | 3/2012 | Nishikawa et al. | |
| 2012/0267646 A1 * | 10/2012 | Kim | H01L 51/5253 257/88 |
| 2017/0025640 A1 * | 1/2017 | Kim | H01L 51/5253 |
| 2019/0027702 A1 | 1/2019 | You et al. | |

FOREIGN PATENT DOCUMENTS

| | | |
|---|---|---|
| CN | 102386340 A | 3/2012 |
| CN | 106784389 A | 5/2017 |
| WO | 9828767 A1 | 7/1998 |

OTHER PUBLICATIONS

International Search Report & Written Opinion dated Feb. 28, 2018, regarding PCT/CN2017/115916.

First Office Action in the Chinese Patent Application No. 201710413528.5, dated Jun. 10, 2019; English translation attached.

* cited by examiner

FIG. 1

*Related Art*

LIGHT-EMITTING DIODE, ARRAY SUBSTRATE, AND METHOD OF MAKING THE SAME

CROSS-REFERENCE TO RELATED APPLICATION

This application is a national stage application under 35 U.S.C. § 371 of International Application No. PCT/CN2017/115916 filed Dec. 13, 2017, which claims priority to Chinese Patent Application No. 201710413528.5, filed Jun. 5, 2017, the contents of which are incorporated by reference in the entirety.

TECHNICAL FIELD

The present disclosure relates to display technology, more particularly, to a light-emitting diode, an array substrate containing the a light-emitting diode, and a method of making the same.

BACKGROUND

Active-Matrix Organic Light Emitting Diode (AMOLED) or AMQLED display has been developed to implement techniques like top-emission and transparent electrodes for effectively enhancing aperture rate and application of dual-side display. These techniques are all related to making top electrode, usually a cathode, substantially transparent. For small form factor AMOLED display panel, ultra-thin cathode layer of about 100 Å to 150 Å is used to meet the requirement of high transmissivity of the array substrate for such display panel. As the size of display panel increases, a drawback of large IR drop caused by large electrical resistance of the ultra-thin cathode layer becomes increasingly a problem to result in luminance non-uniformity of the display. Improved organic light-emitting diode (OLED) device, array substrate, and method of making the same are desired.

SUMMARY

In an aspect, the present disclosure provides a light-emitting diode including a first electrode, a light-emitting layer on the first electrode, and a second electrode on a side of the light-emitting layer distal to the first electrode. The light-emitting diode further includes a substantially transparent protective layer on a side of the second electrode layer distal to the light emitting layer. Additionally, the light-emitting diode includes a substantially transparent conductive layer on a side of the substantially transparent protective layer distal to the second electrode. The substantially transparent conductive layer electrically connected to the second electrode.

Optionally, the light-emitting diode further includes a via extending through the substantially transparent protective layer. The substantially transparent conductive layer is electrically connected to the second electrode through the via.

Optionally, the substantially transparent protective layer includes a plurality of conductive particles. The substantially transparent conductive layer is electrically connected to the second electrode through the plurality of conductive particles.

Optionally, the second electrode includes a metal material, the second electrode having a thickness in a range of approximately 5 nm to approximately 15 nm.

Optionally, the substantially transparent protective layer includes a polymer material containing a material with an unsaturated carbon-carbon double-bond functional group Optionally, the substantially transparent protective layer includes a polymer material containing organic material with an unsaturated carbon-carbon double-bond functional group and/or unsaturated carbon chain.

Optionally, the polymer material includes proximately 5% v/v to 15% v/v the material with an unsaturated carbon-carbon double-bond functional group therein.

Optionally, the substantially transparent protective layer has a thickness in a range from approximately 1 µm to approximately 5 µm with a transmissivity greater than 80%.

Optionally, the via is substantially outside a light emission region of the light-emitting diode.

Optionally, the substantially transparent conductive layer includes a metal oxide material.

Optionally, the metal oxide material includes a multi-sublayer film including a first sublayer overlying the substantially transparent protective layer. The first sublayer is characterized by a largest transmissivity and a smallest stress compared to other sublayers of the multi-layer film on the first layer.

Optionally, the metal oxide material includes a single layer film characterized by gradually reducing transmissivity and increasing stress along a direction from the substantially transparent protective layer to the second electrode.

In another aspect, the present disclosure provides an array substrate including a light-emitting diode described herein, In yet another aspect, the present disclosure provides a display apparatus including an array substrate described above for forming a display panel coupled with a driving circuit.

In still another aspect, the present disclosure provides a method of manufacturing a light-emitting diode in an array substrate for a display panel. The method includes forming a first electrode. The method further includes forming a light-emitting layer on the first electrode. Additionally, the method includes forming a second electrode on a side of the light-emitting layer distal to the first electrode. Furthermore, the method includes forming a substantially transparent protective layer on a side of the second electrode distal to the light-emitting layer. Moreover, the method includes forming a substantially transparent conductive layer on a side of the substantially transparent protective layer distal to the second electrode. The substantially transparent conductive layer and the second electrode are formed to be electrically connected to each other.

Optionally, the method of forming the substantially transparent protective layer includes forming a polymer material layer by depositing a polymer material using a mask plate on a side of the second electrode distal to the light-emitting layer. The polymer material including an unsaturated carbon-carbon double-bond functional group and/or an organic material having unsaturated carbon chain. The method of forming the substantially transparent protective layer further includes curing the polymer material layer thereby forming the substantially transparent protective layer. The mask plate has a pattern including one or more shielded regions for forming one or more vias in the substantially transparent protective layer.

Optionally, the method of forming the polymer material includes heating the unsaturated carbon-carbon double-bond functional group and/or an organic material having unsaturated carbon chain.

Optionally, the polymer material includes approximately 10% v/v polyisoprene in acrylic monomers; depositing the polymer material is performed for a duration of approximately 120 seconds; curing the polymer material layer is performed for a duration of approximately 40 seconds. The substantially transparent protective layer is formed to have a thickness in a range of approximately 2 μm.

Optionally, the method further includes forming a via extending through the substantially transparent protective layer outside a light emission region of the light-emitting diode. The substantially transparent conductive layer is formed to be electrically connected to the second electrode through the via.

Optionally, the method of forming the polymer material further includes doping a plurality of conductive particles thereby forming electrical connections between the substantially transparent conductive layer and the second electrode.

Optionally, the method of forming a substantially transparent conductive layer includes sputtering a metal oxide material on a side of the substantially transparent protective layer distal to the second electrode.

Optionally, the substantially transparent conductive layer is formed to comprise multiple sublayers. The method of sputtering the metal oxide material includes sputtering the metal oxide material at a first deposition rate and a first sputtering power thereby forming a first sublayer and sputtering the metal oxide material at a second deposition rate and a second sputtering power thereby forming a second sublayer. The second deposition rate is greater than the first deposition rate. The second sputtering power is greater than the first sputtering power. The first sublayer is formed to have a highest transmissivity and a lowest stress among all sublayers of the multi-layer film.

Optionally, the substantially transparent conductive layer is formed to comprise a single sublayer. The method of sputtering the metal oxide material includes sputtering the metal oxide material at a gradually increasing deposition rate and a gradually increasing sputtering power over a deposition duration of about 700 seconds.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
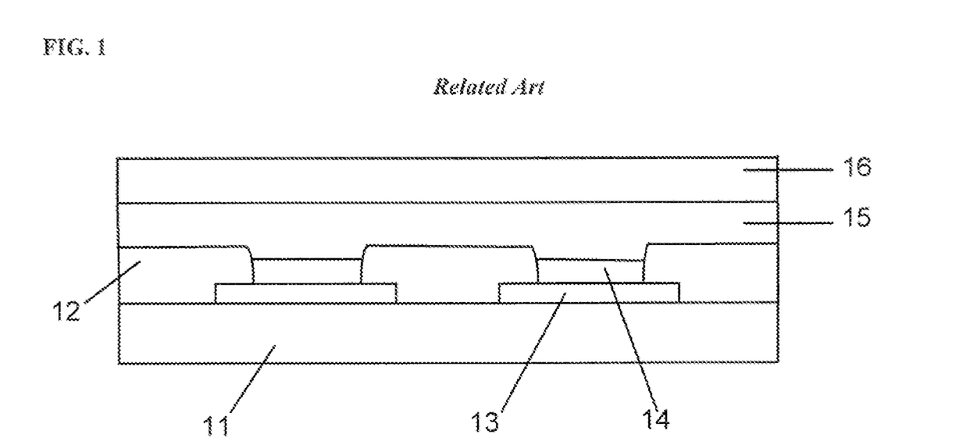
FIG. 1 is a schematic diagram of a related organic light-emitting diode (OLED) structure.

In order to reduce electrical resistance of electrode layer of top emission-type organic light-emitting diode (OLED) device for improving display luminance uniformity, sputtering technique has been used to deposit transparent metal oxide material to form a conductive layer on a cathode layer (the top electrode) of the OLED. FIG. 1 shows a schematic diagram of a conventional organic light-emitting diode structure. On the cathode layer 15, a conductive layer 16 is deposited by sputtering. But, sputtering deposition of the metal oxide material can easily cause damages to the cathode layer 15 and an organic light-emitting layer 14. These damages cause degradation in OLED performance, e.g., an increased leakage current. Free Oxygen radicals released during the sputtering deposition can cause oxidation of the cathode layer 15, increasing the resistivity of the electrode.

Accordingly, the present disclosure provides, inter alia, an organic light-emitting diode (OLED), an array substrate, and a method thereof that substantially obviate one or more of the problems due to limitations and disadvantages of the related art. In one aspect, the present disclosure provides an OLED device including a conductive layer formed with reduced electrical resistance without damaging the cathode layer and organic light-emitting layer.

Figure 2:
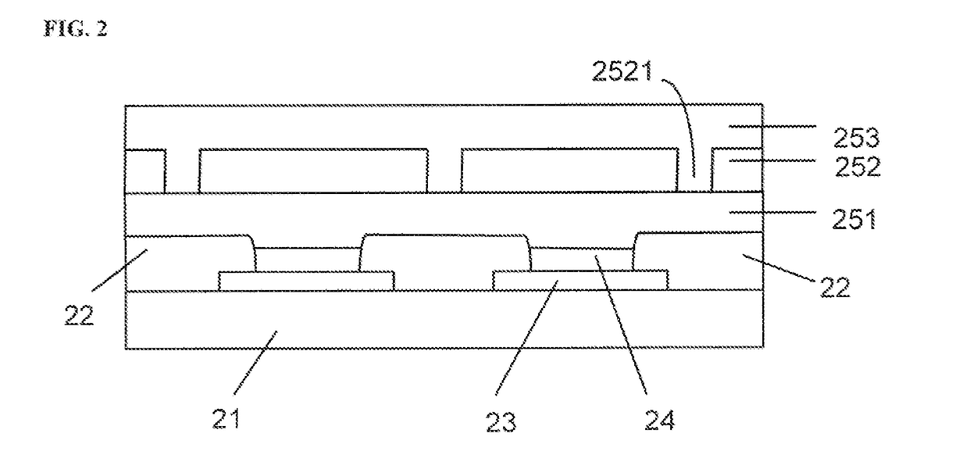
FIG. 2 is a schematic diagram of an OLED structure according to some embodiments of the present disclosure.

FIG. 2 is a schematic diagram of an OLED structure according to some embodiments of the present disclosure. Referring to FIG. 2, the OLED device used in an array substrate is formed on a base substrate 21. A first electrode 23 is formed on the base substrate 21. Optionally, the first electrode 23 is formed in a partial region of the base substrate where is defined as a subpixel region by a pixel-defining layer 22. Optionally, the first electrode 23 is an anode of the OLED device. Further, from the first electrode 23 along a direction more distal to the base substrate 21, an organic light-emitting layer 24 is formed on the first electrode 23. A second electrode 251 is formed on the organic light-emitting layer 24. Optionally, the second electrode 251 is also overlying the pixel defining layer 22. Optionally, the second electrode 251 is a cathode of the OLED device, and the first electrode 23 is an anode of the OLED device. Optionally, the second electrode 251 is an anode of the OLED device, and the first electrode 23 is a cathode of the OLED device. A protective layer 252 is formed overlying the second electrode 251. A conductive layer 253 is formed overlying the protective layer 252.

Referring to FIG. 2, the second electrode 251 is made to be substantially transparent to visible light. Optionally, the second electrode 251 is made by transparent metal material or transparent metal oxide material. The second electrode 251 is on top of the organic light-emitting layer 24. Therefore, the characteristics of the substantially transparent second electrode 251 makes the OLED device suitable as a top-emission OLED or as a dual-side emission OLED. Optionally, the metal material used for making the second electrode 251 is selected from metal material with low work function. For example, Al/Ag alloy, Ag, Mg:Ag mixture, and Lanthanide metals as well as any combination of above are selected for making the second electrode 251 to enhance light-emission transmissivity thereof. Optionally, the second electrode 251 can be made with an ultra-thin thickness of approximately 50 Å to approximately 150 Å with a transmissivity of approximately 80%.

As used herein, the term "substantially transparent" means a transmissivity of at least 50 percent (e.g., at least 60 percent, at least 70 percent, at least 80 percent, at least 90 percent, and at least 95 percent) of light in the visible wavelength range transmitted therethrough.

The conductive layer 153 is configured to lower the electrical resistivity of the second electrode 251 for enhancing the OLED performance. Referring to FIG. 2, the conductive layer 253 is also made to be substantially transparent using a transparent conductive material, e.g., a substantially transparent metal oxide conductive material. Basically, the substantially transparent metal oxide conductive material is selected from one of several metal oxide materials, indium tin oxide, indium zinc oxide, aluminum-doped zinc oxide, with high transmissivity for visible light and low electrical resistivity. Optionally, the thickness of the conductive layer 253 made by the transparent metal oxide material is in a range from approximately 5000 Å to approximately 10000 Å.

Optionally, this transparent metal oxide material can be deposited using sputtering deposition method. Referring to FIG. 2, since there is a protective layer 252 formed overlying the second electrode 251, direct damages to the second electrode 251 and the organic light-emitting layer 24 during the sputtering deposition process are substantially reduced. Additionally, when the second electrode 251 is made by metal material, the protective layer 252 also prevents the oxidation of the metal material in the second electrode 251 induced by free Oxygen radicals released during the sputtering process.

Figure 5:
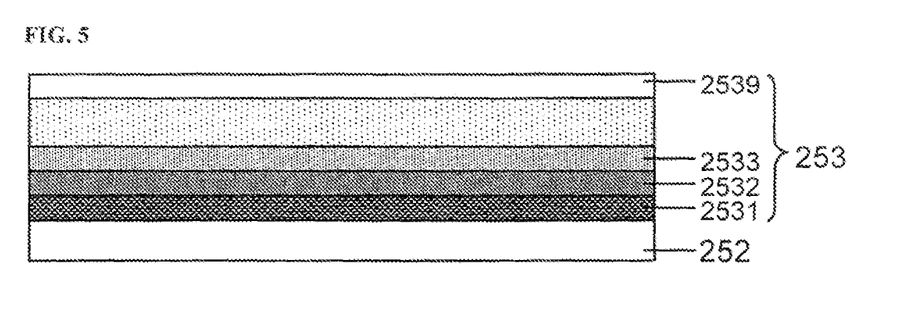
FIG. 5 is a schematic diagram of a transparent metal oxide layer configured as a multi-sublayer structure according to some embodiments of the present disclosure.

In an embodiment, the conductive layer 253 is a structure including multi-sublayers. As shown in FIG. 5, the conductive layer 253 in some embodiments includes a first sublayer 2531 formed on the protective layer 152, sequentially a second sublayer 2532 formed on the first sublayer 2531, a third sublayer 2533 formed on the second sublayer 2532, and so on with the last sublayer 2539 formed on top. Optionally, forming the multi-sublayer structure of the conductive layer 253 can be performed using multi-layer sputtering deposition with each sublayer being formed under different sputtering process conditions. Each sublayer is made to be substantially transparent and conductive. When forming the first sublayer, a sputtering condition with a low sputtering power and a low deposition rate is selected so that the potential damage of the sputtering process to the second electrode and the organic light-emitting layer is substantially reduced. When forming the second, third, or other subsequent sublayers, sputtering conditions with higher sputtering powers and high deposition rates are selected to enhance production.

The transmissivity of a conductive metal oxide layer formed by low sputtering power in low deposition rate is higher than the transmissivity of another conductive metal oxide layer formed by high sputtering power in high deposition rate. Also, the stress inside the sublayer formed with lower power and lower deposition rate is smaller than the stress inside the sublayer formed with higher power and higher deposition rate. In an embodiment, among many conductive sublayers of the conductive layer 253, the sublayer (e.g., 2531) most proximal to the protective layer 252 has a highest transmissivity than other sublayers and a smallest stress therein than other sublayers. For forming any other sublayers of the conductive layer 253 more distal to the protective layer 252, the sputtering process uses higher deposition rate and higher power. For forming a sublayer at the most distal position relative to the protective layer 252, the sputtering process uses a highest deposition rate and a highest power that is suitable for depositing the corresponding conductive material.

Optionally, when performing the multi-layer sputtering deposition, sputtering each sublayer can be performed using different materials or the same material.

Optionally, the conductive layer 253 is formed by performing a single-layer sputtering deposition to form just a single layer (or a single sublayer) in one sputtering process. During the single-layer sputtering deposition, the sputtering condition for depositing the single conductive layer 253 of metal oxide material on the second electrode 251 is dynamically changed. The deposition of the metal oxide material starts with a low deposition rate and low power and gradually increasing the sputtering power to increase the deposition rate. The lower deposition rate near the beginning of the single-layer sputtering process helps to reduce potential damages of sputtered species of the metal oxide material to the second electrode 251 and the organic light-emitting layer 24 below. Then, the sputtering condition is set to gradually increasing sputtering power and deposition rate until the end of the single-layer sputtering process. In the conductive layer 253 formed by the single-layer sputtering process described above, from the protective layer 252 along a direction more distal to the protective layer, the transmissivity of the conductive layer 253 gradually decreases and the stress of the conductive layer 253 gradually increases.

Referring to FIG. 2 again, the protective layer 252 plays an important role of forming the OLED device with improved performance according to the present disclosure. In an embodiment, the protective layer 252 is made by an insulation material with one or more vias 2521 through the protective layer 252 to allow the conductive layer 253 to fill the vias and form an electrical contact with the second electrode 251. Optionally, the locations of the vias 2521 are set to be outside the light-emission region where the organic light-emitting layer 24 and the first electrode 23 are located. Although the second electrode layer 251 underneath the via 2521 is not directly protected during the sputtering deposition of the conductive layer 253, any potential damages to the OLED device caused by the sputtering process can be minimized by setting the via 2521 outside the light emission region.

Optionally, multiple types of insulation materials can be selected for making the protective layer 252. In an embodiment, a polymer material is used to form the protective layer. Optionally, the polymer material contains organic materials with unsaturated carbon-carbon double bond functional groups. Optionally, the polymer material contains an organic material with unsaturated carbon chain. Optionally, the polymer contains an organic material with unsaturated carbon-carbon double bond functional group and unsaturated carbon chain.

Optionally, the polymer material is a substantially transparent polymer material. Optionally, the substantially transparent polymer material has a transmissivity greater than a threshold value, e.g., the threshold transmissivity is 80%.

Optionally, the unsaturated carbon bonds, represented by a formula $C_mH_n$, in the polymer material are selected such that the polymer material can be easily oxidized. Optionally, $8000 \leq 2m-n \leq 11000$. Optionally, $20000 \leq m \leq 27500$. Optionally, $8000 \leq 2m-n \leq 11000$, and $20000 \leq m \leq 27500$.

Optionally, the polymer material includes approximately 5% v/v to 15% v/v organic material therein. Because of the unsaturated carbon-carbon bonds inside the organic material have relatively strong chemical reactivity induced by light, heat, or radiation, so the relative small 5%-15% volume ratio of the organic material is set to effectively remove free Oxygen radicals released during the sputtering process while ensuring no reduction of anti-aging capability of the polymer material. As the free Oxygen radicals released during the sputtering process for forming the conductive layer 253 are more likely to react with the organic material with unsaturated carbons, it substantially reduces possibility of oxidation of the metal material in the second electrode 251 by the Oxygen radicals.

Optionally, the thickness of the polymer material for making the protective layer 252 is in a range of approximately 1 µm to approximately 5 µm. Optionally, the polymer material can be deposited by a printing process or a hot vapor deposition, using a mask plate.

Optionally, the polymer material can be one or more selected from an unsaturated carbon chain polyisoprene mixed in a polymethyl methacrylate film, a polyimide film, a parylene group, a polyacrylate or an acrylic monomer. Particularly, unsaturated carbon chain polyisoprene is easy to react with the free Oxygen radicals released from the sputtering process to reduce possibility of oxidation of the metal material in the second electrode 251.

Figure 3:
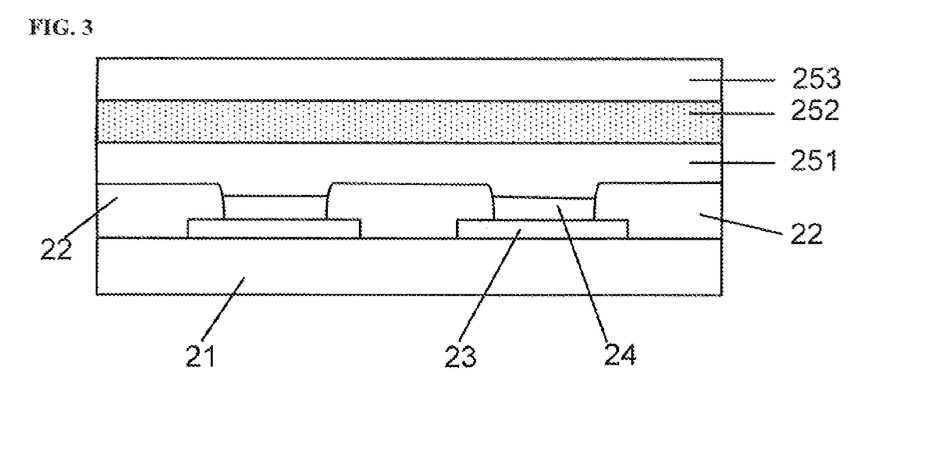
FIG. 3 is a schematic diagram of an OLED structure according to some embodiments of the present disclosure.

FIG. 3 shows a schematic diagram of an OLED structure according to some embodiments of the present disclosure. Referring to FIG. 3, in another embodiment, the OLED device is formed on a base substrate 21 on which a first electrode 23 is formed on respective subpixel regions defined by a patterned pixel-defining layer 22. An organic light-emitting layer 24 is formed on the fust electrode 23. A pixel-defining layer 22 is formed to define a plurality of light emission regions. The organic light-emitting layer 24 is formed in one of the plurality of light emission regions. A second electrode 251 is then formed on the organic light-emitting layer 24. A protective layer 252 is formed overlying the second electrode 251. A conductive layer 253 is formed overlying the protective layer 252. Both the protective layer 252 and the conductive layer 253 are made to be substantially transparent to visible light. Iin the embodiment, the protective layer 252 is made to be a conductive layer by doping a plurality of conductive particles into an insulation material. Since the protective layer 252 is in between the second electrode 251 and the conductive layer 253, the second electrode 251 forms an electrical contact with the conductive layer 253 through the conduction provided by the plurality of conductive particles doped inside the protective layer 252. In the embodiment, there is no via through the protective layer 252 which can fully cover the second electrode 251 to provide effective protection of the second electrode and the organic light-emitting layer of the OLED device.

Optionally, a polymer material is used to form the protective layer 252 of the OLED shown in FIG. 3. Optionally, the polymer material contains organic materials with unsaturated carbon-carbon double bond functional groups. Optionally, the polymer material contains an organic material with unsaturated carbon chain. Optionally, the polymer contains an organic material with unsaturated carbon-carbon double bond functional group and unsaturated carbon chain.

Optionally, the polymer material is a transparent polymer material. As referred herein, the transparent polymer material has a transmissivity greater than a threshold value, e.g., the threshold transmissivity is 80%.

Optionally, the unsaturated carbon bonds, represented by a formula CmHn, in the polymer material are selected such that the polymer material can be easily oxidized. Optionally, $8000 \leq 2m-n \leq 11000$. Optionally, $20000 \leq m \leq 27500$. Optionally, $8000 \leq 2m-n \leq 11000$, and $20000 \leq m \leq 27500$.

Optionally, the polymer material includes approximately 5% v/v to 15% v/v organic material therein. Optionally, the thickness of the polymer material for making the protective layer 252 is in a range of approximately 1 µm to approximately 5 µm.

Figure 4:
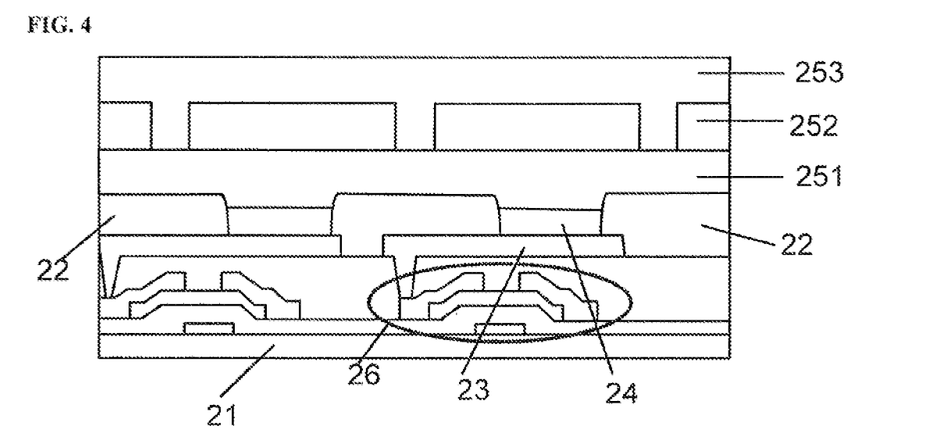
FIG. 4 is a schematic diagram of an OLED array substrate structure according to some embodiments of the present disclosure.

In another aspect, the present disclosure provides an OLED array substrate including the OLED device described herein. FIG. 4 is a schematic diagram of an OLED array substrate structure according to some embodiments of the present disclosure. Referring to FIG. 4, the OLED array substrate includes a base substrate 21, a thin-film transistor array layer 26 formed on the base substrate 21. Additionally, the OLED array substrate includes a pixel-defining layer 22 for defining each subpixel, and at each subpixel region an OLED device is formed with at least an anode 23 formed on the base substrate 21 and an organic light-emitting layer 24 formed on the anode 23. A cathode 251 is formed overlying the organic light-emitting layer 24 in each subpixel region as well as the pixel-defining layer 22. Furthermore, a protection layer 252 is formed at least partially overlying the cathode 251. Moreover, a conductive layer 253 is formed overlying the protection layer 252. The protection layer 252 also includes some vias 2521 allowing conductive material of the conductive layer 253 to fill in and form electrical contact with the cathode 251.

In an embodiment, the conductive layer 253 and the cathode 251 (which is typically made by metal material) provide a hybrid cathode with lower electrical resistivity for enhancing the OLED performance. Between the cathode 251 and the conductive layer 253, a protective layer 252 is formed. Yet, the cathode 251 forms an electrical connection with the conductive layer 253 through some vias 2521. The protective layer 252 is configured to protect the cathode 251 and the organic light-emitting layer 24 underneath from potential damages occurred during a process of forming the conductive layer 253, thereby ensuring that a performance of the OLED array substrate can be enhanced by lower electrical resistivity of the cathode and substantially no damages to the light-emitting layer in each OLED device.

Optionally, the vias 2521 in the protective layer 252 are formed in non-emission regions, e.g., on the pixel-defining layer 22 outside the organic light-emitting layer 24. As the conductive layer 253 is formed using a sputtering deposition process, the potential damage of the sputtering process to the cathode 251 and organic light-emitting layer 24 in the light-emission regions is substantially eliminated.

Optionally, the OLED device also includes, other than the organic light-emitting layer 24, one or more layers selected from a hole-injection layer, a hole-transport layer, an electron-transport layer, and an electron-injection layer. Optionally, the organic light-emitting layer is formed by one or a combination of the following methods including hot vapor deposition, inkjet printing, and transfer printing (such as laser transfer printing). Optionally, the thin-film transistor array 26 typically includes gate electrodes, gate insulation layers, active layers, source electrodes, and drain electrodes. A drain electrode of a thin-film transistor is connected to an anode 23 of an OLED device in a subpixel.

In an alternative aspect, the present disclosure provides an OLED display apparatus including an OLED array substrate described herein. The display apparatus can be a display panel or a display apparatus including a display panel and a driving circuit.

Figure 6:
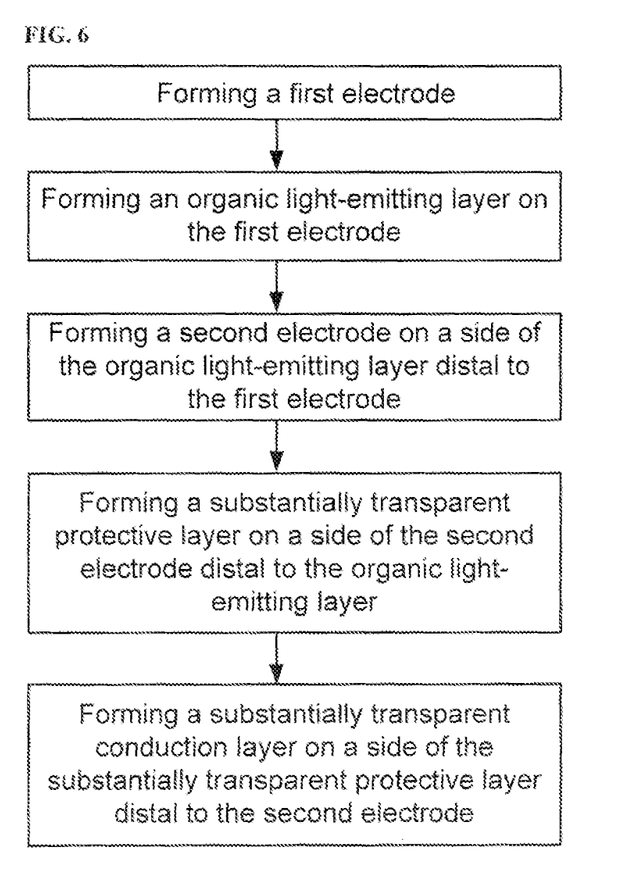
FIG. 6 is a flow chart showing a method of making an organic light-emitting diode in an array substrate according to some embodiments of the present disclosure.

In yet another aspect, the present disclosure provides a method of making the OLED device. The method is used to form the OLED device described herein. FIG. 6 shows a flow chart of multiple steps of a method for making the OLED device according to some embodiments of the present disclosure. Referring to FIG. 6, the method includes forming a first electrode. The first electrode is formed on a base substrate. Optionally, the first electrode is an anode. The method further includes forming an organic light-emitting layer on the first electrode. Additionally, the method includes forming a second electrode on a side of the organic light-emitting layer distal to the first electrode. The method further includes forming a substantially transparent protective layer on a side of the second electrode distal to the organic light-emitting layer. Furthermore, the method includes forming a substantially transparent conductive layer on a side of the substantially transparent protective layer distal to the second electrode.

Optionally, the method of forming the organic light-emitting layer also includes forming one or a combination of several layers including a hole-injection layer, a hole-transport layer, an electron-transport layer, and an electron-injection layer. Optionally, forming the organic light-emitting layer is performed using hot vapor deposition, inkjet printing, or laser transfer printing. In an example, forming the organic light-emitting layer is performed in a vacuum chamber at $5 \times 10^{-5}$ Pa or lower pressure using hot vapor by heating a linear source of organic material to deposit the organic light-emitting layer. The deposition rate is about 4 Å/s. A mask plate is pre-disposed on the base substrate to cover areas without the first electrode and allow the organic light-emitting layer to form on top of the first electrode. Optionally, the organic light-emitting layer has a thickness of approximately 3000 Å.

Optionally, forming the second electrode includes forming a thin transparent layer using low work function metal material. For example, Al/Ag alloy, Ag, Mg:Ag mixture, and Lanthanide metals as well as any combination of above are selected for making the second electrode to enhance light-emission transmissivity thereof. Optionally, the second electrode has a thickness in a range from approximately 50 Å to approximately 150 Å with a transmissivity of approximately 80%. In an example, forming the second electrode includes using a multi-source vapor deposition process. Mg and Ag metal sources are used for depositing a Mg:Ag mixture onto the organic light-emitting layer with Mg deposition rate of about 1 Å/s and Ag deposition rate of about 0.2 Å/s to form a metal electrode layer of about 120 Å.

Optionally, forming the substantially transparent protective layer on a side of the second electrode distal to the organic light-emitting layer includes forming a layer having multiple types of insulation materials. Optionally, the insulation material is a polymer material. Optionally, the polymer material includes an organic material containing unsaturated carbon-to-carbon double bond functional group and/or unsaturated carbon chain. Optionally, the polymer material is a substantially transparent material with a transmissivity greater than a threshold of 80%. In an example, the unsaturated carbon chain material, CmHn, of the organic material in the polymer material is selected such that unsaturated carbon chain is easy to be oxidized. Optionally, $8000 \leq 2m-n \leq 11000$. Optionally, $20000 \leq m \leq 27500$. Optionally, $8000 \leq 2m-n \leq 11000$, and $20000 \leq m \leq 27500$. Optionally, the organic material in the polymer material has a volume ratio in a range of approximately 5% v/v to approximately 15% v/v. Optionally, forming the substantially transparent protective layer includes forming a polymer material of a thickness in a range of approximately 1 μm to approximately 5 μm. The unsaturated carbon-to-carbon double bond functional group and/or unsaturated carbon chain in the polymer material is susceptible to reaction with free oxygen radical released during the sputtering process for forming the substantially transparent conductive layer on a side of the substantially transparent protective layer. Therefore, the concentration of free oxygen radicals released during the sputtering process can be reduced, reducing possibility of oxidation of the metal material in the second electrode.

Optionally, the method of forming the substantially transparent protective layer includes setting a mask plate on a side of the second electrode. The mask plate includes a shielding region and an opening region. The shielding region is a projection of the vias in the protective layer. The opening region is a projection of rest portion of the protective layer. Further, the method includes heating the polymer material to perform a hot vapor deposition of the polymer material onto the second electrode through the opening region of the mask plate. The polymer material is an insulation material and the vias are configured as through-holes extending through the protective layer thereby allowing conductive material subsequently formed to fill in. Furthermore, the method includes curing the polymer material deposited on the second electrode to obtain the protective layer. Optionally, other methods of using inkjet printing or laser printing based on masking setting can be used to form the substantially transparent protective layer.

Optionally, the polymer material includes approximately 10% v/v polyisoprene in acrylic monomers. The deposition duration for forming the polymer material by hot vapor deposition is approximately 120 s. The curing time is approximately 40 s. The resulted protective layer has a thickness of approximately 2 μm.

Optionally, the substantially transparent protective layer can be formed as a conductive layer by doping a plurality of conductive particles in an insulation material (e.g., a polymer material) so that the second electrode can form an electrical contact with a subsequently formed conductive layer though the plurality of conductive particles. Forming the conductive protective layer is performed by depositing a whole layer of insulation material while doping the plurality of conductive particles to a certain doping concentration. No masking process is required. The whole layer of insulation material covers entire the second electrode to provide effective protection of the second electrode as well as the organic light-emitting layer below from potential damages by sputtering process of the conductive layer thereon.

Optionally, forming the substantially transparent conductive layer on a side of the substantially transparent protective layer distal to the second electrode includes forming a transparent metal oxide layer by sputtering. In an embodiment, forming the transparent metal oxide layer is performed using a multi-layer sputtering process to form a multi-sublayer structure. When performing the multi-layer sputtering process to deposit the first sublayer, a sputtering power at the lowest level is used with a lowest deposition rate. When depositing the second sublayer or any other subsequent sublayer, an increasing sputtering power is used with an increasing deposition rate. The lower the deposition rate is, the less likely is to cause damages to the second electrode and the organic light-emitting layer below. The increasing sputtering power for subsequent sublayers is used for enhancing production efficiency with increased deposition rate. In the embodiment, the method of using lower sputtering power lower deposition rate for sputtering metal oxide material leads to a sublayer characterized by higher transmissivity and lower stress therein. In other words, the first sublayer of the conductive layer formed in contact with the protection layer has a transmissivity higher than any other sublayers more distal to the protective layer and an internal stress lower than that in any other sublayers more distal to the protective layer. Optionally, at least the first sublayer is able to fill the vias in the protective layer below to make an electrical contact between the metal material in the second electrode and the conductive layer. Optionally, at least the first sublayer is able to form direct electrical contact with the metal material in the second electrode through a plurality of conductive particles doped in the protective layer.

In another embodiment, forming the transparent metal oxide layer is performed using a single-layer sputtering process. Optionally, sputtering the transparent metal oxide material includes sputtering the metal oxide material at a gradually increasing deposition rate and a gradually increasing sputtering power. In an example for sputtering indium zinc oxide (IZO), the sputtering process is performed in a vacuum chamber with pressure being set to about $5 \times 10^{-5}$ Pa using Ar as sputtering gas at a pressure of about 0.7 Pa, at a sputtering power of about 5 KW and deposition time of about 700 s to form an IZO layer of about 8000 Å. Other metal oxide materials like indium tin oxide (ITO), aluminum zinc oxide (AZO) can be used to form the transparent conductive layer.

Optionally, before forming the transparent conductive layer using sputtering deposition method, a transparent protective layer is firstly formed to protect the second electrode as well as the organic light-emitting layer from any potential damages caused by the subsequent sputtering process.

Table below shows a performance comparison of a conventional OLED array substrate and au OLED array substrate provided according to the present disclosure.

| Type | Cathode electrical resistance (Ω/block) | Device leakage current (mA/cm$^2$) at −5 V |
| --- | --- | --- |
| Conventional | 4.4 | $3.5 \times 10^{-3}$ |
| Present Disclosure | 2.8 | $5.2 \times 10^{-4}$ |

As shown, the block cathode resistance of each OLED device in the OLED array substrate provided according to the present disclosure is reduced by 44% compared to the conventional OLED array substrate. Also, the device leakage current in the OLED array substrate of the present disclosure has been reduced by almost one order of magnitude.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of manufacturing a light-emitting diode in an array substrate for a display panel, the method comprising:
   forming a first electrode;
   forming a light-emitting layer on the first electrode;
   forming a second electrode on a side of the light-emitting layer distal to the first electrode;
   forming a substantially transparent protective layer on a side of the second electrode distal to the light-emitting layer; and
   forming a substantially transparent conductive layer on a side of the substantially transparent protective layer distal to the second electrode, wherein the substantially transparent conductive layer and the second electrode are formed to be electrically connected to each other;
   wherein the forming a substantially transparent conductive layer comprises sputtering a metal oxide material in multiple sublayers on a side of the substantially transparent protective layer distal to the second electrode; wherein the sputtering the metal oxide material comprises sputtering the metal oxide material at a first deposition rate and a first sputtering power thereby forming a first sublayer and sputtering the metal oxide material at a second deposition rate and a second sputtering power thereby forming a second sublayer, the second deposition rate being greater than the first deposition rate, the second sputtering power being greater than the first sputtering power; wherein the first sublayer is formed to have a highest transmissivity and a lowest stress among all sublayers of the multi-layer film.

2. The method of claim 1, wherein the forming the substantially transparent protective layer comprises:
   forming a polymer material layer by depositing a polymer material through a mask plate on a side of the second electrode distal to the light-emitting layer, the polymer material comprising an unsaturated carbon-carbon double-bond functional group and/or an organic material having unsaturated carbon chain; and
   curing the polymer material layer thereby forming the substantially transparent protective layer;
   wherein the mask plate has a pattern including one or more shielded regions for forming one or more vias in the substantially transparent protective layer.

3. The method of claim 2, wherein the forming the polymer material layer includes heating the unsaturated carbon-carbon double-bond functional group and/or an organic material having unsaturated carbon chain.

4. The method of claim 2, wherein the forming the polymer material comprises depositing approximately 10% v/v polyisoprene in acrylic monomers for a duration of approximately 120 seconds and curing for a duration of approximately 40 seconds to form the substantially transparent protective layer comprising a thickness in a range of approximately 2 µm.

5. The method of claim 1, further comprising forming a via extending through the substantially transparent protective layer outside a light emission region of the light-emitting diode;
   wherein the substantially transparent conductive layer is formed to be electrically connected to the second electrode through the via.

6. The method of claim 2, wherein the forming the polymer material further comprises doping a plurality of conductive particles thereby forming electrical connections between the substantially transparent conductive layer and the second electrode.

* * * * *